United States Patent
Leng et al.

(10) Patent No.: US 10,818,748 B2
(45) Date of Patent: Oct. 27, 2020

(54) THIN-FILM RESISTOR (TFR) FORMED UNDER A METAL LAYER AND METHOD OF FABRICATION

(71) Applicant: Microchip Technology Incorporated, Chandler, AZ (US)

(72) Inventors: Yaojian Leng, Portland, OR (US); Bonnie Hamlin, Gresham, OR (US); Andrew Taylor, Tigard, OR (US); Janet Vanderiet, Wood Village, OR (US); Justin Sato, West Linn, OR (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/034,394

(22) Filed: Jul. 13, 2018

(65) Prior Publication Data
US 2019/0348494 A1 Nov. 14, 2019

Related U.S. Application Data

(60) Provisional application No. 62/670,880, filed on May 14, 2018.

(51) Int. Cl.
*H01L 49/02* (2006.01)
*H01L 21/285* (2006.01)
*H01L 21/311* (2006.01)

(52) U.S. Cl.
CPC ......... *H01L 28/24* (2013.01); *H01L 21/2855* (2013.01); *H01L 21/31111* (2013.01)

(58) Field of Classification Search
CPC ............... H01L 21/31111; H01L 28/24; H01L 21/2855; H01L 28/20
See application file for complete search history.

(56) References Cited

U.S. PATENT DOCUMENTS 5,447,763 A * 9/1995 Gehlke ............... H01J 27/26
250/423 R
5,593,601 A * 1/1997 Hsieh ................. H01L 28/24
216/100

(Continued)

FOREIGN PATENT DOCUMENTS

CN 104051614 A 9/2014 ............ H01L 45/00

OTHER PUBLICATIONS

International Search Report and Written Opinion, Application No. PCT/US2019/030309, 11 pages, dated Aug. 8, 2019.

*Primary Examiner* — Matthew C Landau
*Assistant Examiner* — Mark Hatzilambrou
(74) *Attorney, Agent, or Firm* — Slayden Grubert Beard PLLC

(57) ABSTRACT

A method for manufacturing a thin film resistor (TFR) module includes forming a TFR element over a substrate; annealing the TFR element to reduce the temperature coefficient of resistance (TCR) of the TFR element; and after forming and annealing the TFR element, forming a pair of conductive TFR heads in contact with the TFR element. By forming the TFR element before the TFR heads, the TFR element may be annealed without affecting the TFR heads, and thus may be formed from various materials with different annealing properties, e.g., SiCCr and SiCr. Thus, the TFR element may be annealed to achieve a near 0 ppm TCR, without affecting the later-formed TFR heads. The TFR module may be formed using a damascene CMP approach and using only a single added mask layer. Further, vertically-extending "ridges" at edges of the TFR element may be removed or eliminated to further improve the TCR performance.

11 Claims, 17 Drawing Sheets

(56) References Cited

U.S. PATENT DOCUMENTS

| | | | |
|---|---|---|---|
| 9,679,844 B2 | 6/2017 | Leng et al. | |
| 2002/0197844 A1 | 12/2002 | Johnson et al. | 438/618 |
| 2006/0065898 A1 | 3/2006 | Murakami et al. | 257/76 |
| 2007/0008062 A1 | 1/2007 | Fivas et al. | 338/25 |
| 2010/0323499 A1* | 12/2010 | Takahashi | C23C 14/165 438/478 |
| 2013/0093024 A1 | 4/2013 | Eshun | 257/379 |
| 2016/0372420 A1* | 12/2016 | Leng | H01L 23/5226 |

\* cited by examiner

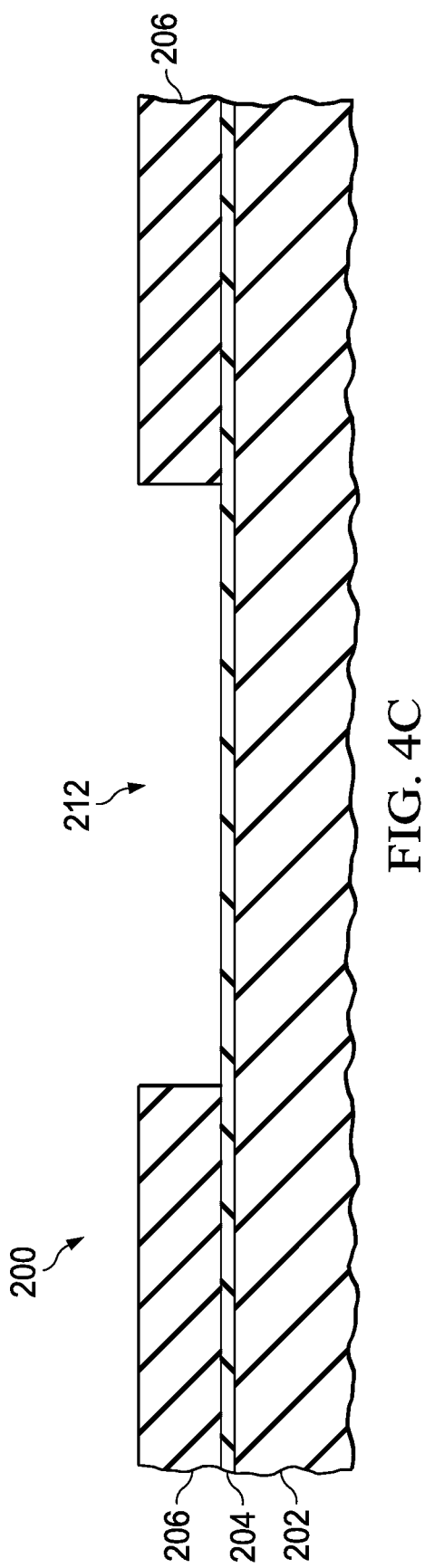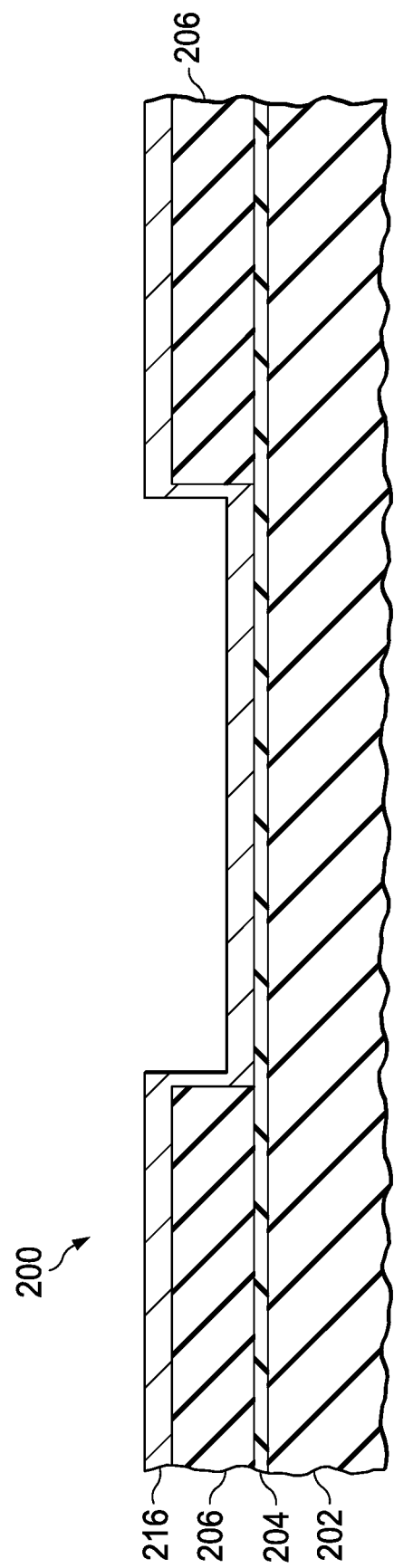

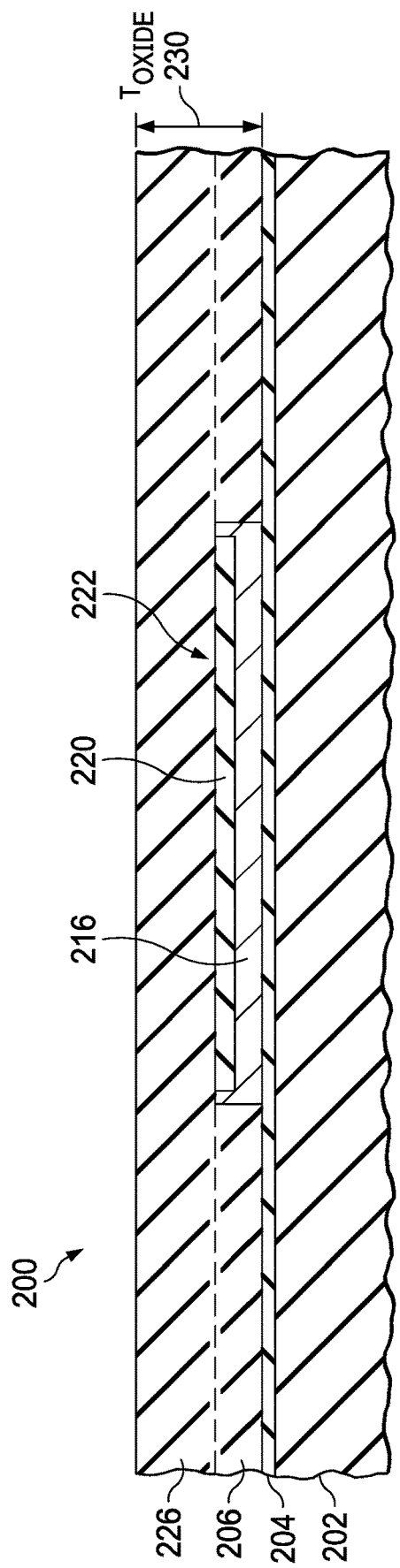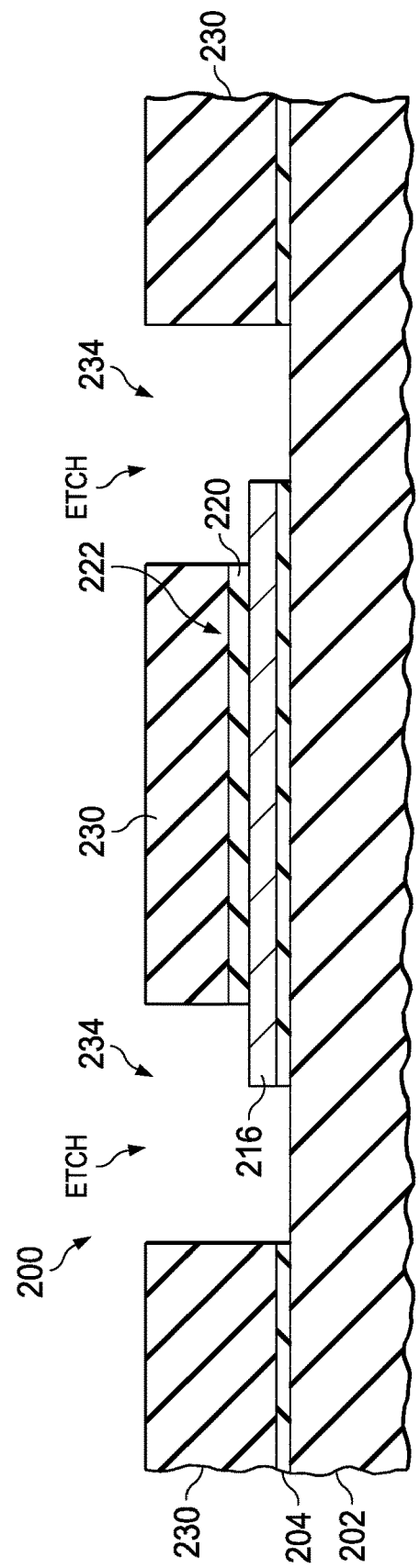

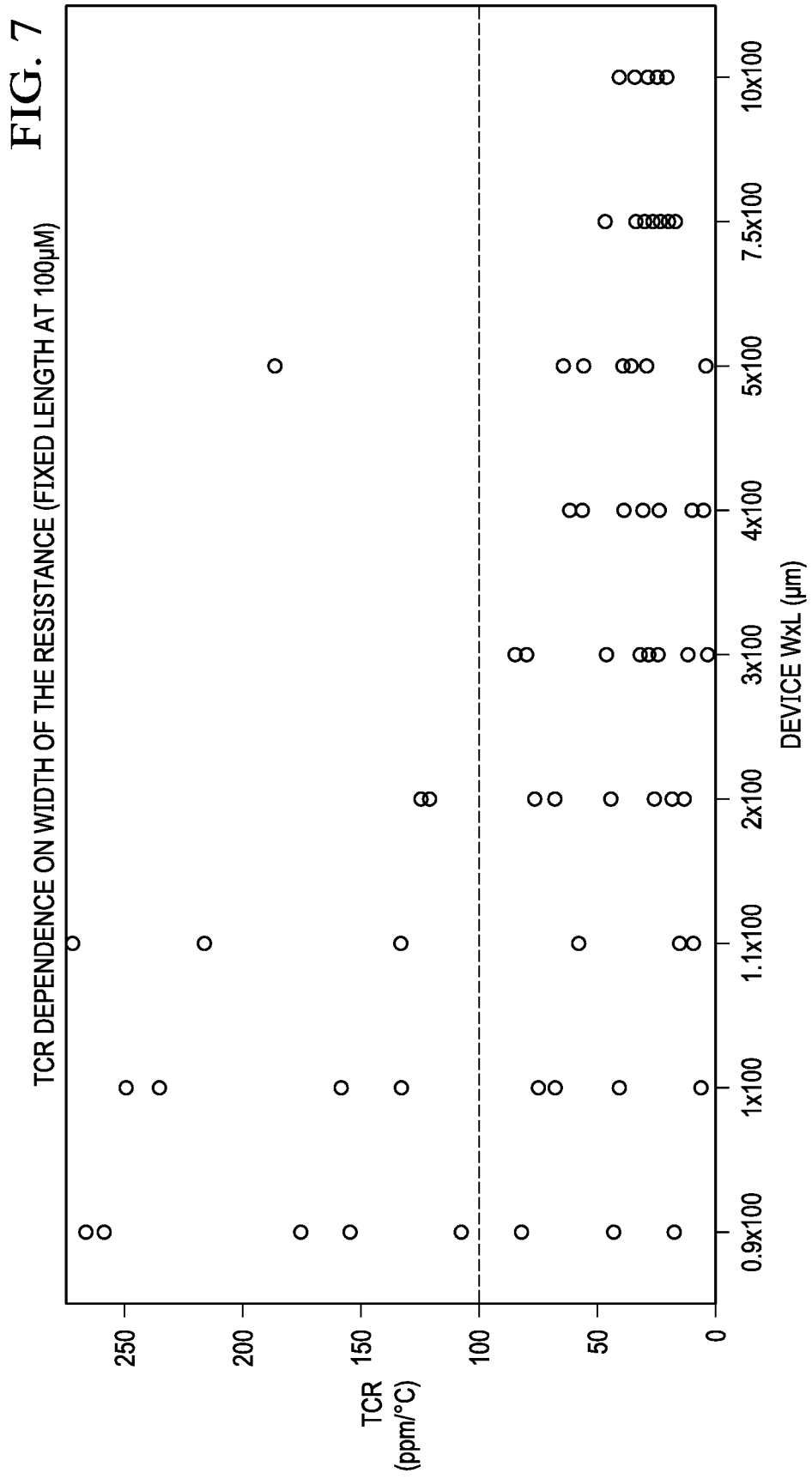

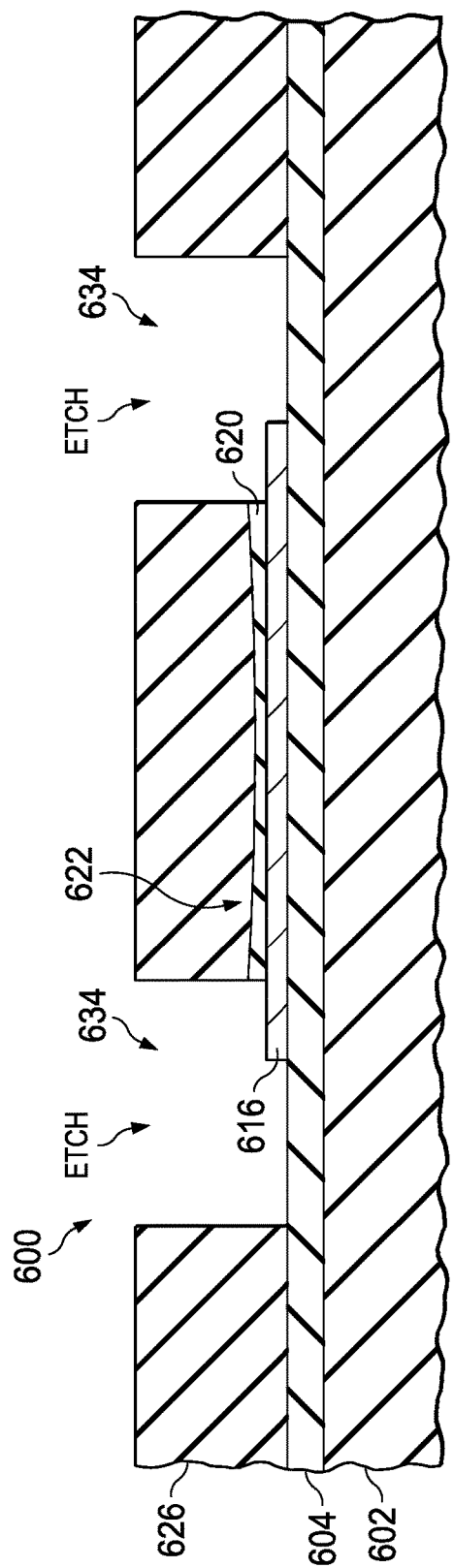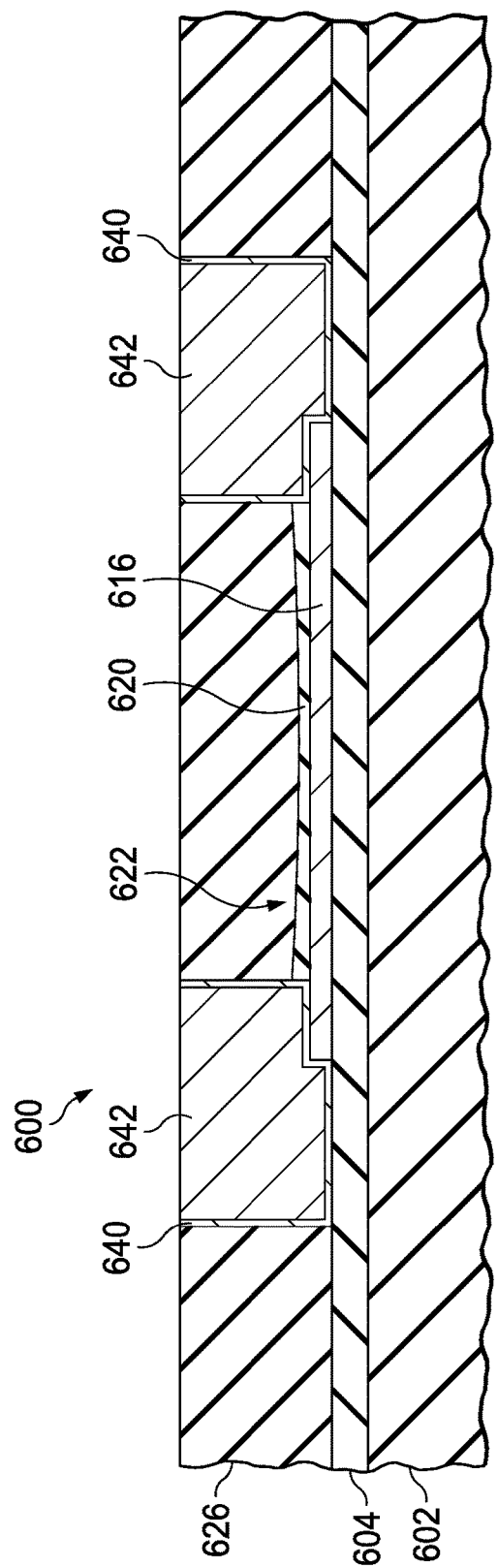

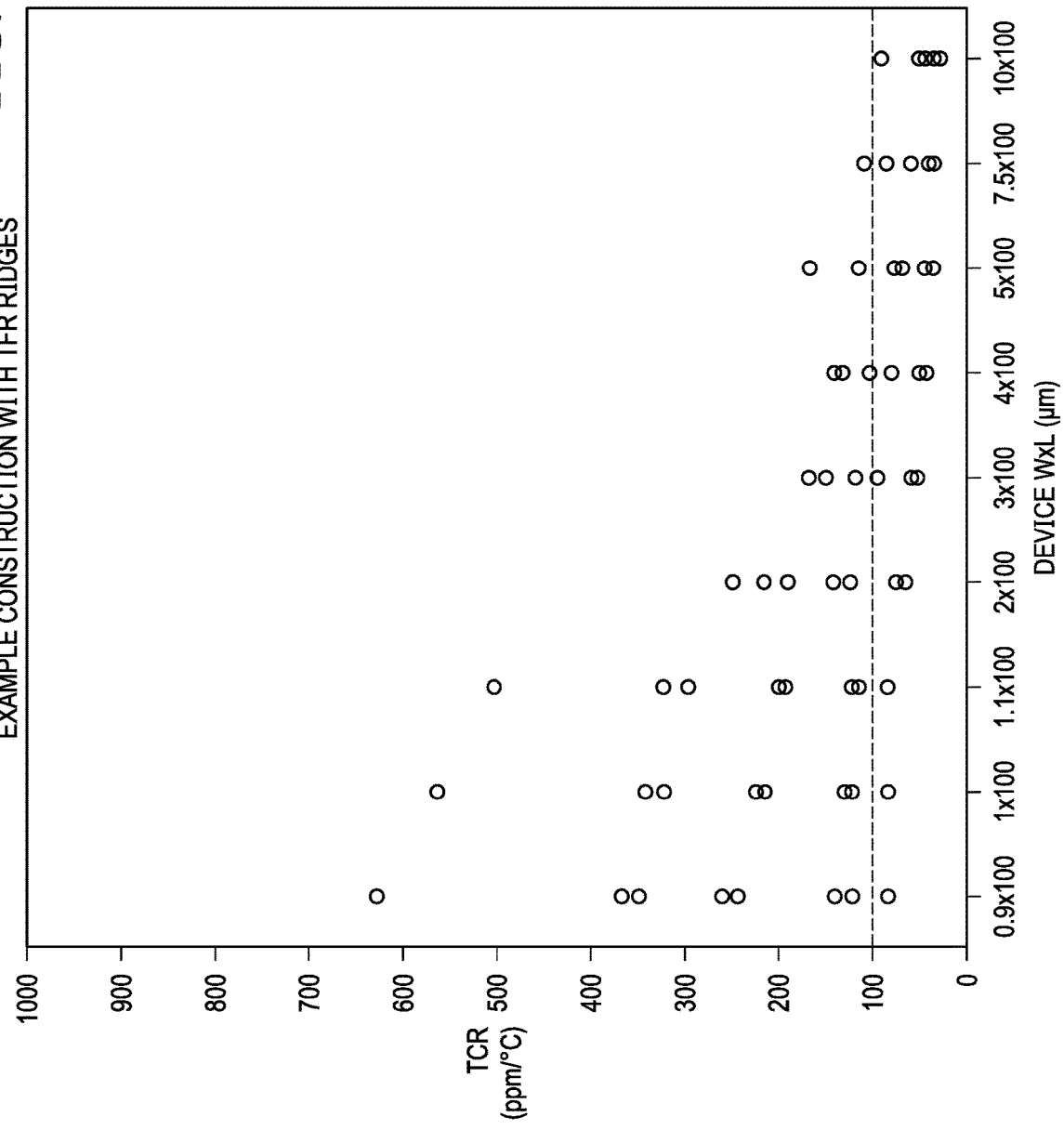

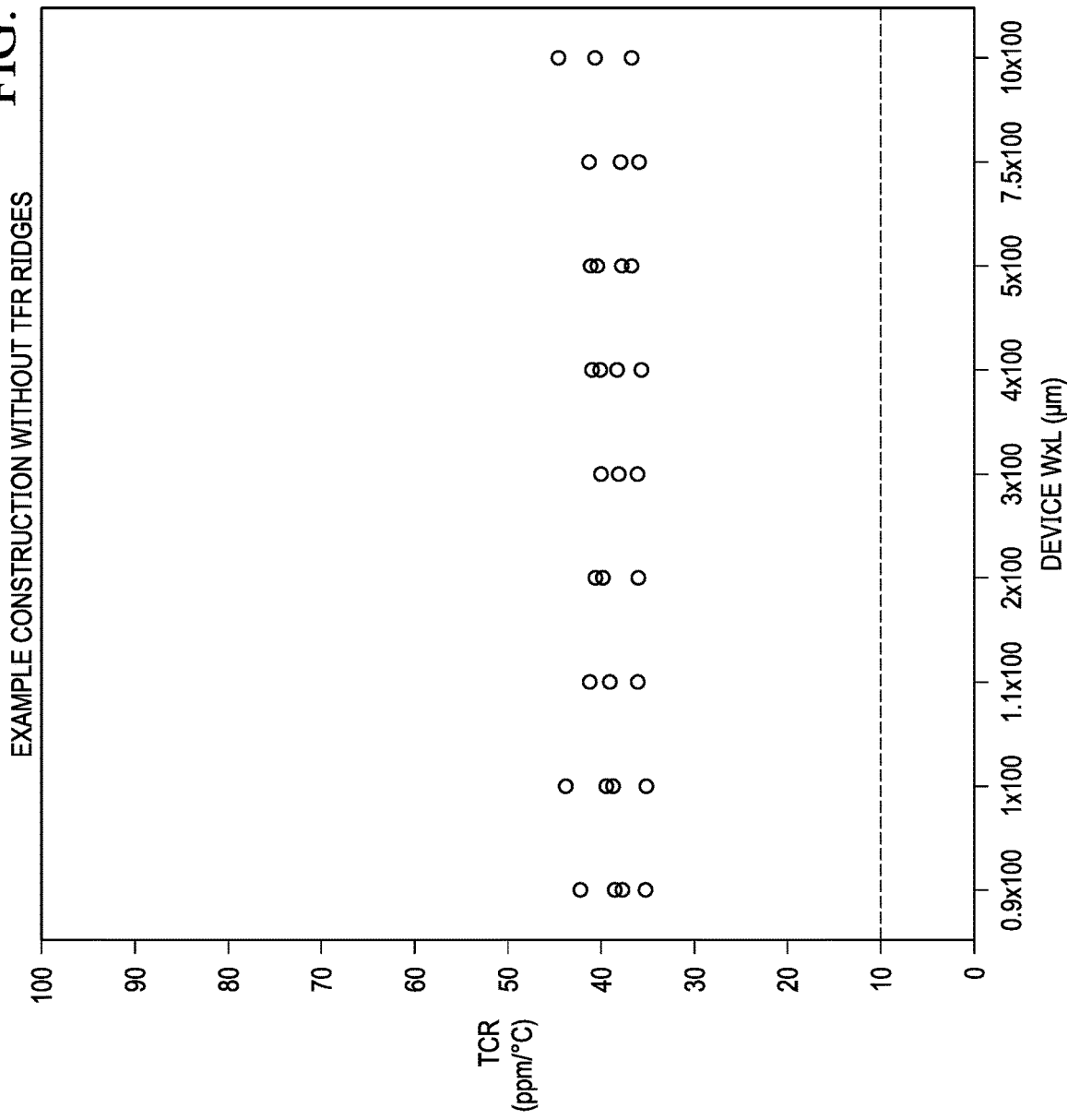

US 10,818,748 B2

THIN-FILM RESISTOR (TFR) FORMED UNDER A METAL LAYER AND METHOD OF FABRICATION

RELATED PATENT APPLICATION

This application claims priority to commonly owned U.S. Provisional Patent Application No. 62/670,880 filed May 14, 2018, the entire contents of which are hereby incorporated by reference for all purposes.

TECHNICAL FIELD

The present disclosure relates to thin-film resistors (TFRs), in particular to TFR modules having TFR elements formed underneath the respective TFR heads/contacts, and methods for manufacturing such TFR modules.

BACKGROUND

Semiconductor integrated circuits (IC) typically include metallization layers used to connect various components of the IC, called interconnect, or back end of line (BEOL) elements. Copper often preferred over aluminum due to its lower resistivity and high electro-migration resistance. Copper interconnect, however, is typically difficult to manufacture with traditional photoresist masking and plasma etching used for aluminum interconnect.

One known technique for forming copper interconnects on an IC is known as additive patterning, sometimes called a damascene process, which refers to traditional metal inlaying techniques. A so-called damascene process may include patterning dielectric materials, such as silicon dioxide, or fluorosilicate glass (FSG), or organo-silicate glass (OSG) with open trenches where the copper or other metal conductors should be. A copper diffusion barrier layer (typically Ta, TaN, or a bi-layer of both) is deposited, followed by a deposited copper seed layer, followed by a bulk Copper fill, e.g., using an electro-chemical plating process. A chemical-mechanical planarization (CMP) process may then be used to remove any excessive copper and barrier, and may thus be referred to as a copper CMP process. The copper remaining in the trench functions as a conductor. A dielectric barrier layer, e.g., SiN or SiC, is then typically deposited over the wafer to prevent copper corrosion and improve device reliability.

With more features being packed into individual semiconductor chips, there is an increased need to pack passive components, such as resistors, into the circuits. Some resistors can be created through ion implantation and diffusion, such as poly resistors. However, such resistors typically have high variations in resistance value, and may also have resistance values that change drastically as a function of temperature. A new way to construct integrated resistors, called Thin-Film Resistors (TFRs) has been introduced in the industry to improve integrated resistor performance. Known TFRs are typically formed from SiCr (silicon-chromium), SiCCr (silicon-silicon carbide-chromium), TaN (tantalum nitride), NiCr (nickel-chromium), AlNiCr (aluminum-doped nickel-chromium), or TiNiCr (titanium-nickel-chromium), for example.

FIG. 1 shows a cross-sectional view of two example TFRs 10A and 10B devices implemented using conventional processes. Fabrication of conventional TFRs 10A and 10B devices typically requires three added mask layers. A first added mask layer is used to create the TFR heads 12A and 12B. A second added mask layer is used to create the TFRs 14A and 14B. A third added mask layer is used to create TFR vias 16A and 16B. As shown, TFRs 12A and 12B are formed across the top and bottom of TFR heads 12A and 12B, respectively, but in each case three added mask layers are typically required.

FIG. 2 shows a cross-sectional view of a known IC structure including an example TFR 30 formed in view of the teachings of U.S. Pat. No. 9,679,844, wherein TFR 30 can be created using a single added mask layer and damascene process. A TFR film 34, in this example a SiCCr film, may be deposited into trenches patterned into a previously processed semiconductor substrate. As shown, SiCCr film 34 is constructed as a resistor between conductive (e.g., copper) TFR heads 32, with an overlying dielectric region including a dielectric layer 36 (e.g., SiN or SiC) and a dielectric cap region 38 (e.g., SiO2) formed over the SiCCr film 34. The IC structure including TFR 30 may be further processed for a typical Cu (copper) interconnect process (BEOL), e.g., next level of via and trench. TFR 30 may be connected with other parts of the circuit using typical copper vias 40 connected to the copper TFR heads 32 for example.

Embodiments of TFR 30 may be particularly suitable for copper BEOL, which may have limitations regarding annealing (e.g., anneal temperature may be limited to about 200° C.). However, there is a need to construct TFR before metallization (either Cu or Al), so the TFR can be annealed at high temperature (e.g., around 500° C.) to achieve 0 ppm or near 0 ppm temperature coefficient of resistance (TCR). Further, there is a need or advantage (e.g., cost and time advantage) to reduce the number of mask layers required to construct the TFR.

BRIEF DESCRIPTION OF THE DRAWINGS

Example aspects of the present disclosure are described below in conjunction with the figures, in which:

FIG. 4A-4I illustrate an example process for forming the example IC structure with integrated TFR shown in FIG. 3, according to one example embodiment;

FIG. 7 is a graph showing example temperature coefficient of resistance (TCR) data for example TFR modules formed according to the process shown in FIGS. 4A-4I;

FIG. 10A-10J illustrate an example process for forming an example IC structure with an integrated TFR module in which TFR ridges are removed, according to one example embodiment; and FIGS. 11A and 11B are graphs showing temperature coefficient of resistance (TCR) data for example TFR modules with TFR ridges (FIG. 11A) and example TFR modules without TFR ridges (FIG. 11B), indicating an effect of TFR ridges on the TCR of respective TFR modules.

SUMMARY

Embodiments of the present disclosure provide thin-film resistors (TFRs) having TFR elements formed underneath the respective TFR heads/contacts, methods for manufacturing such TFR modules, and integrated circuit devices including such TFR modules. In some embodiments, TFR modules may be formed using a damascene CMP approach, e.g., in contrast to a wet or dry etch process.

Further, in some embodiments, TFR modules may be formed using a single mask layer. For example, the TFR heads and contacts may be defined by a metal layer (e.g., M1 layer) formed over, and thus after, the TFR element, which may eliminate one or two mask layers as compared the fabrication process for certain conventional TFR modules, which may reduce costs as compared with conventional fabrication processes. As the TFR element is formed before the TFR heads/contacts, the TFR film may be annealed without affecting the later-formed TFR head/contact structures, and thus may be formed from various materials with different annealing properties or requirements, including SiCCr and SiCr, for example. Thus, the TFR element may be annealed to achieve 0 ppm or near 0 ppm TCR, without affecting the later-formed TFR heads/contacts.

In some embodiments, "ridges" at lateral edges of the TFR film/element may be removed or eliminated by a suitable ridge removal process, e.g., including a cleaning and wet etch (e.g., mixed acid etch) process. Removal of the TFR ridges may provide controlled or improved TCR performance.

DETAILED DESCRIPTION

Embodiments of the present disclosure provide thin-film resistors (TFRs) having TFR elements formed underneath the respective TFR heads/contacts, methods for manufacturing such TFR modules, and integrated circuit devices including such TFR modules.

Figure 1:
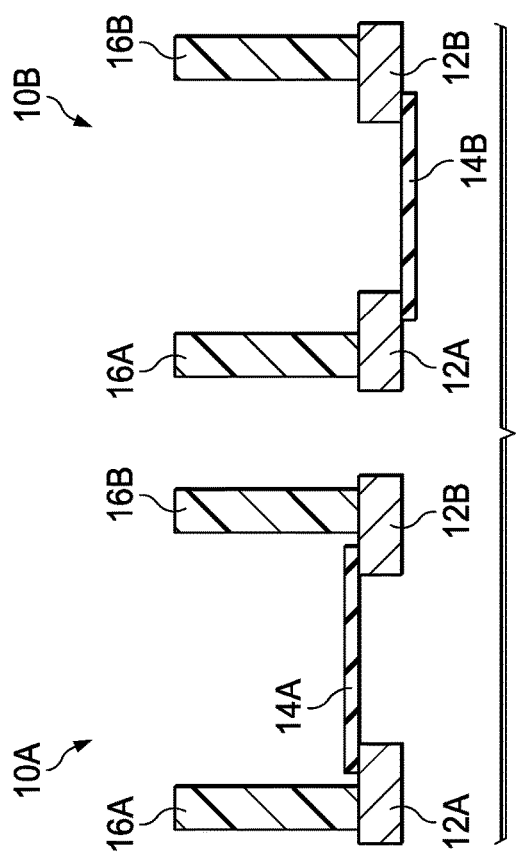
FIG. 1 is a cross-sectional view of two example thin-film resistor (TFR) devices implemented using known processes.
Figure 2:
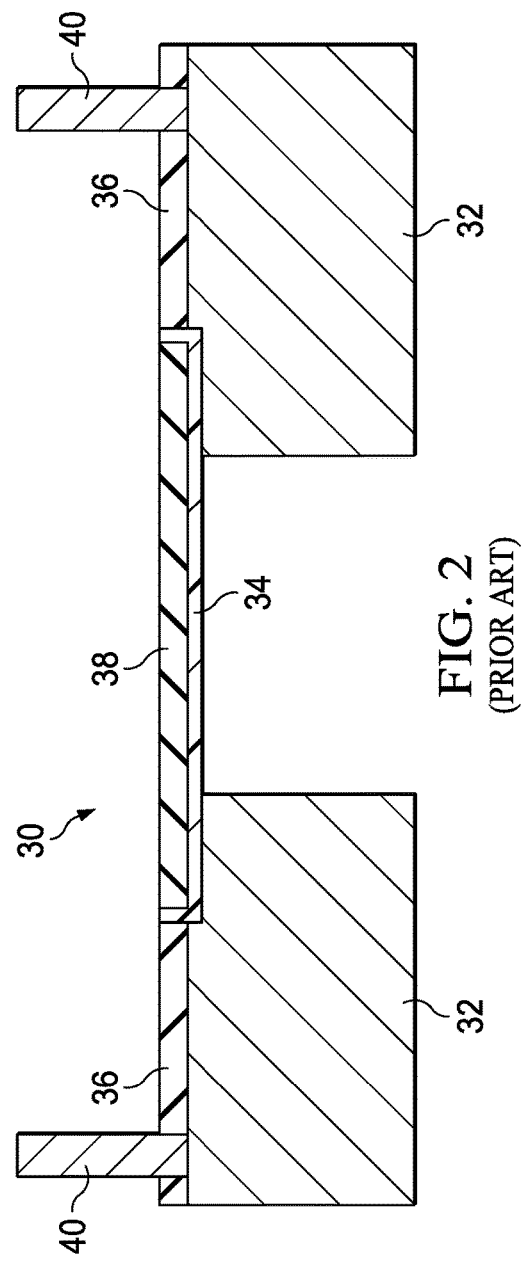
FIG. 2 is a cross-sectional view of a known integrated circuit (IC) structure including an example TFR formed according to known techniques.
Figure 3:
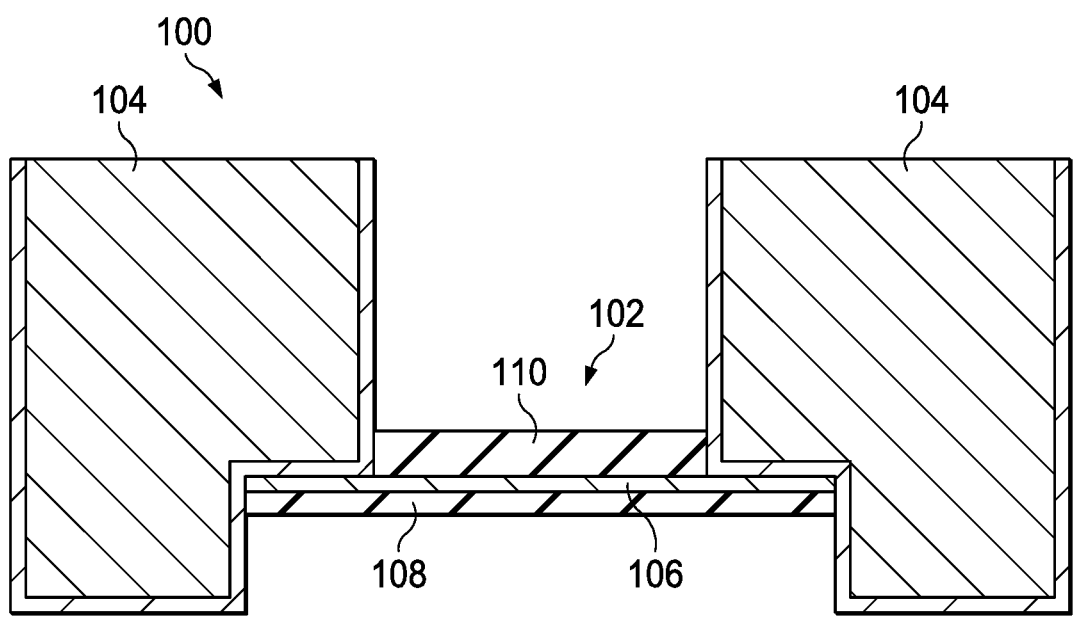
FIG. 3 shows an example thin-film resistor (TFR) module formed according to one embodiment of the present invention.

FIG. 3 shows an example thin-film resistor (TFR) module 100 formed according to one embodiment of the present disclosure. TFR module 100 may include a TFR 102 formed underneath and generally between a pair of metal TFR head/contact structures 104, and may be formed using a single added mask layer, e.g., according to the example approaches discussed below with reference to FIGS. 4A-4I and FIGS. 10A-10J. As shown in FIG. 3, TFR 102 may include a TFR film 106 formed between a lower dielectric layer 108 and an upper dielectric layer 110. Because TFR 102 is formed underneath, and thus prior to, metal TFR head/contact structures 104, TFR film 106 may be annealed without affecting the later-formed TFR head/contact structures 104, and thus may be formed from various materials with different annealing properties or requirements, including SiCCr and SiCr, for example. Thus, in some embodiments, TFR 102 may be annealed during the fabrication process (e.g., prior to forming TFR head/contact structures 104) to achieve 0 ppm or near 0 ppm TCR.

Figure 4A:
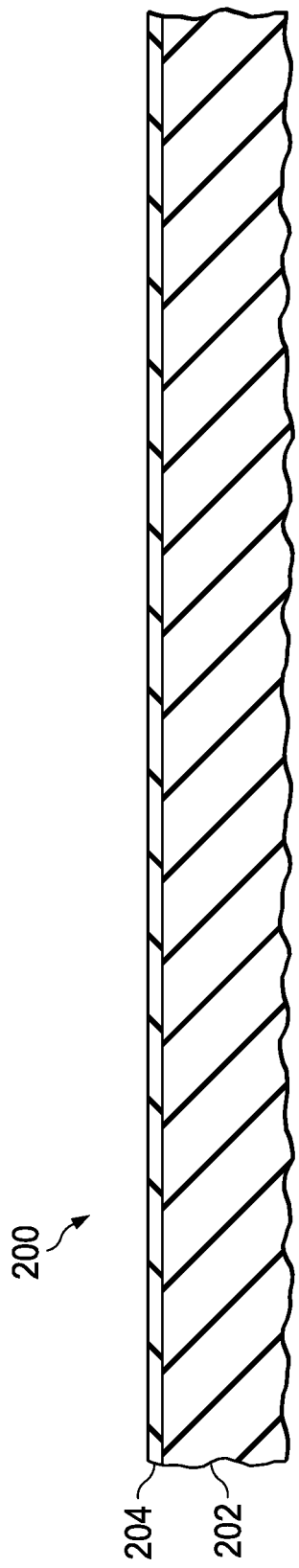

FIG. 4A-4I illustrate an example process for forming the example IC structure 200 including the TFR module shown in FIG. 3, according to one example embodiment. In some embodiments, the TFR module may be formed after a W CMP (tungsten chemical mechanical polishing) process. FIG. 4A shows the initial formation of an IC structure 200, by forming a dielectric layer 204 over field oxide 202. In one embodiment, dielectric layer 204 may comprise a SiN layer having a thickness of about 500 Å (e.g., 400 Å-600 Å). Dielectric layer 204 may define a "metal 1" trench etch stop layer, e.g., as part of a typical CMOS process flow.

Figure 4B:
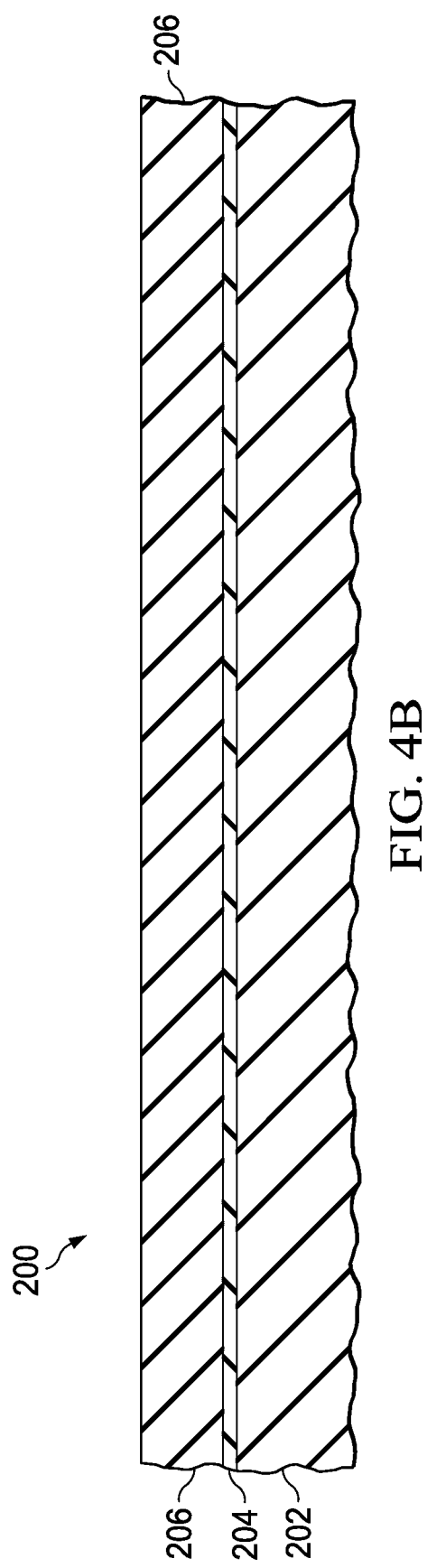

As shown in FIG. 4B, structure 200 may be further processed by depositing an oxide layer 206 having a thickness of about 1500 Å (e.g., 1000 Å-2000 Å).

As shown in FIG. 4C, structure 200 may be further processed by using a photo resist to pattern and etch layer 206 to define a TFR trench 212. The etch may remove the patterned area of layer 206 and stop on or in the dielectric layer (e.g., SiN) 204. The photo resist may be stripped after the etch.

As shown in FIG. 4D, structure 200 may be further processed by depositing a layer of TFR material 216 over the structure and extending into the TFR trench 212, e.g., using a PVD or sputter deposition process. In one embodiment, TFR layer 216 may comprise a SiCr layer with a thickness of about 500 Å (e.g., 400 Å-600 Å). In other embodiments, TFR layer 240 may comprise SiCCr, TaN, NiCr, AlNiCr, TiNiCr, or any other suitable TFR material. In some embodiments, the TFR layer thickness may be selected based on a target sheet resistance, e.g., 500-1000 Ω/sq.

Figure 10A:
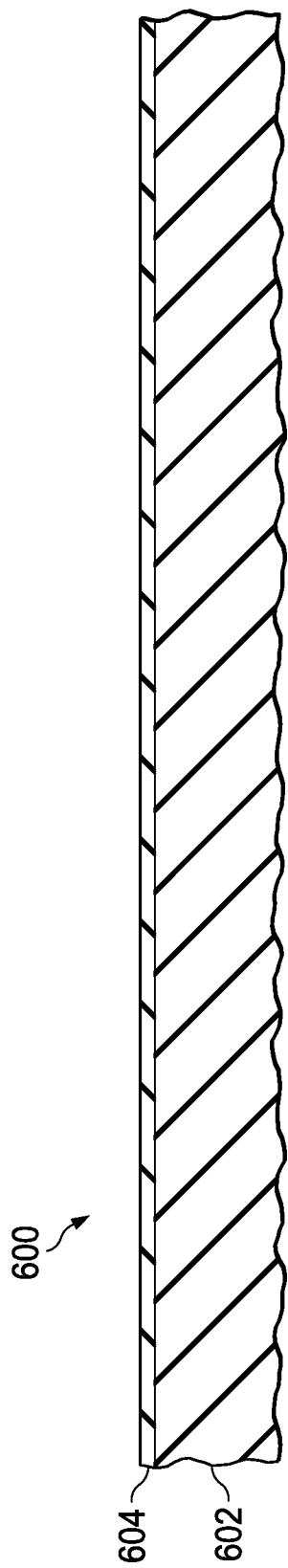
Figure 10B:
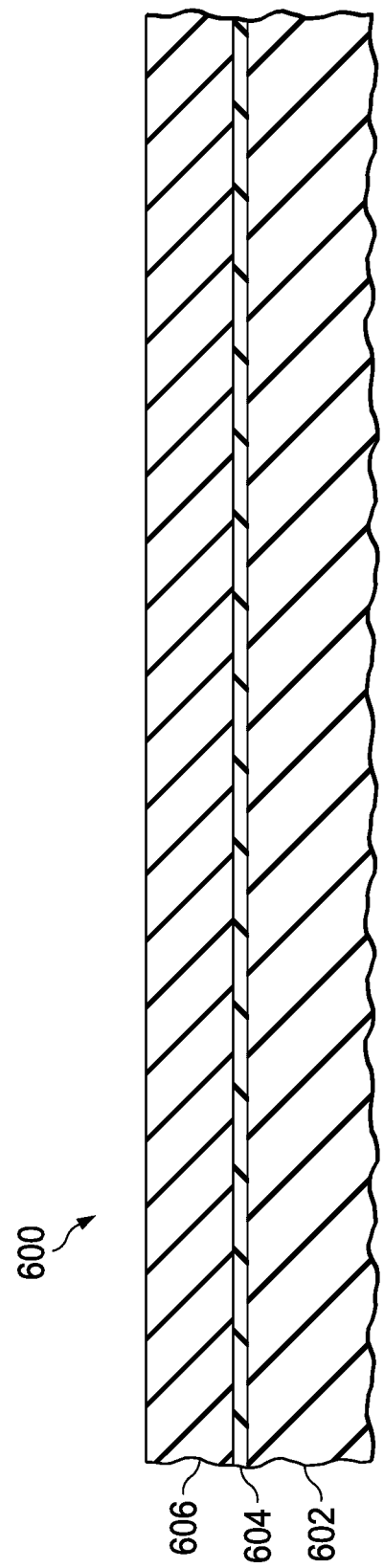
Figure 10C:
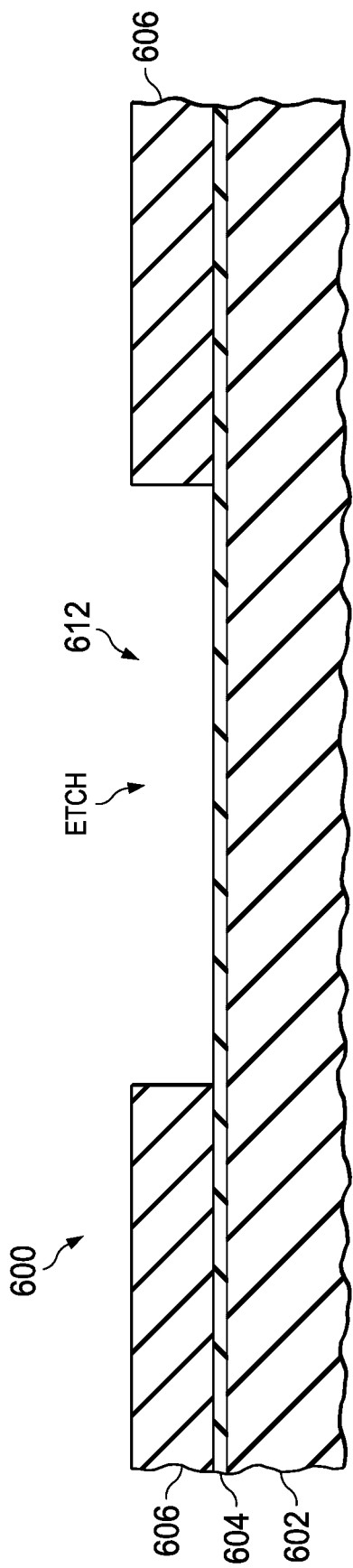
Figure 10D:
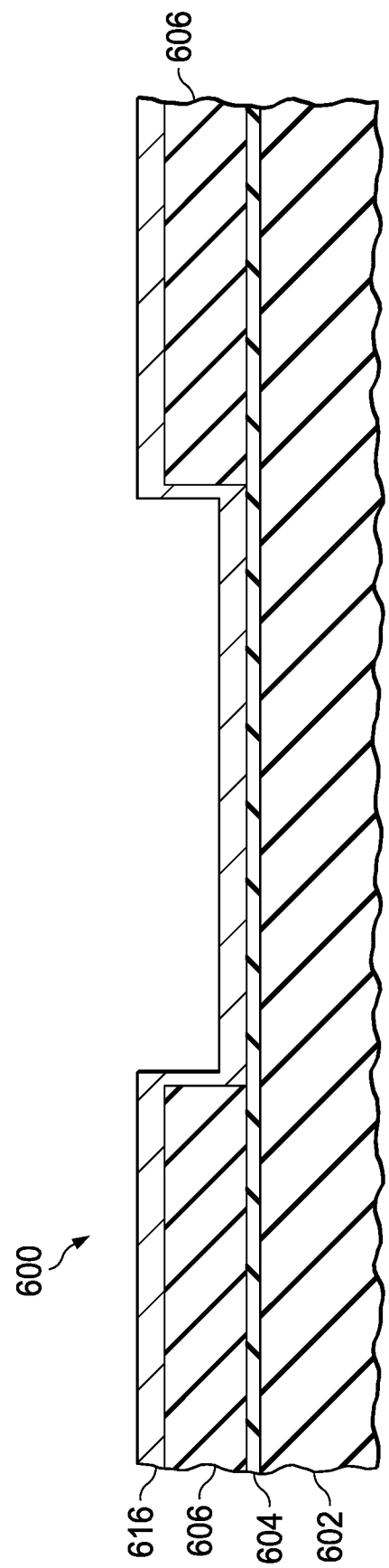
Figure 10E:
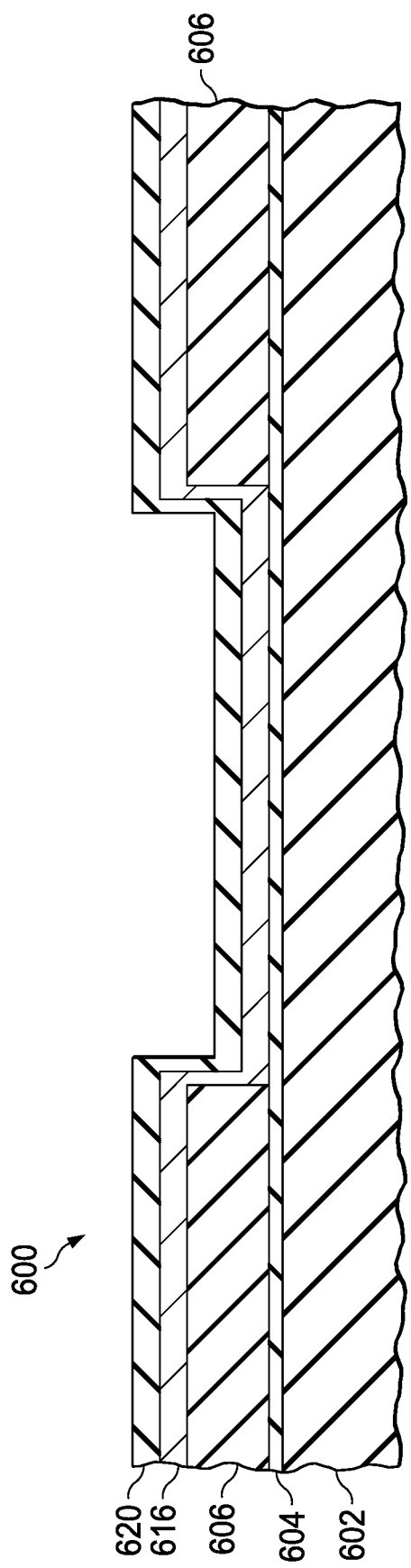

Structure 200 including TFR layer 216 may then be annealed, e.g., at a temperature of about 500° C. (e.g., 400° C.-600° C. or 450° C.-550° C.) for about 30 minutes (e.g., 20-60 min) to achieve 0 ppm or near 0 ppm TCR (temperature coefficient of resistance) of the TFR layer 216 or the resulting TFR module 222 (discussed below). In some embodiments, "near 0" ppm TCR may include a TCR of 0±400 ppm/° C., or a TCR of 0±100 ppm/° C., or a TCR of 0±50 ppm/° C., or a TCR of 0±20 ppm/° C., or a TCR of 0±10 ppm/° C., depending on the particular embodiment. In some particular embodiments, TFR layer 216 or TFR module 222 may have a TCR of about 40 ppm/° C., e.g., 40±30 ppm/° C., or 40±20 ppm/° C., or 40±10 ppm/° C., e.g., as shown in FIG. 10B discussed below.

Figure 4E:
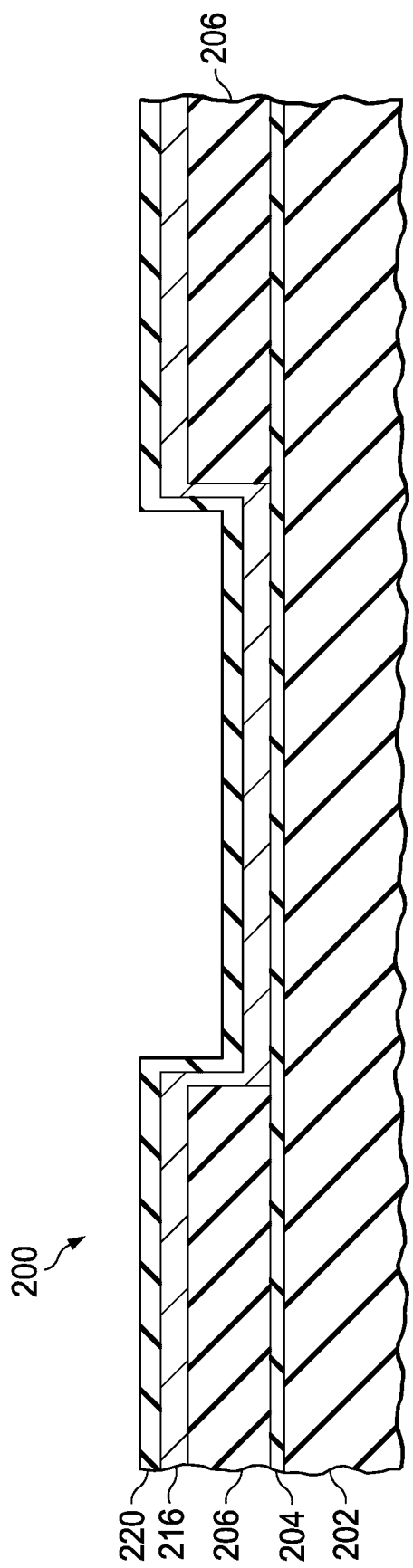

As shown in FIG. 4E, structure 200 may be further processed by depositing a dielectric cap layer 220 on structure 200, to protect TFR film 216. In one embodiment, dielectric cap layer 220 may comprise a SiN layer with a thickness of about 500 Å (e.g., 400 Å-600 Å) or about 750 Å (e.g., 600 Å-900 Å)

Figure 4F:
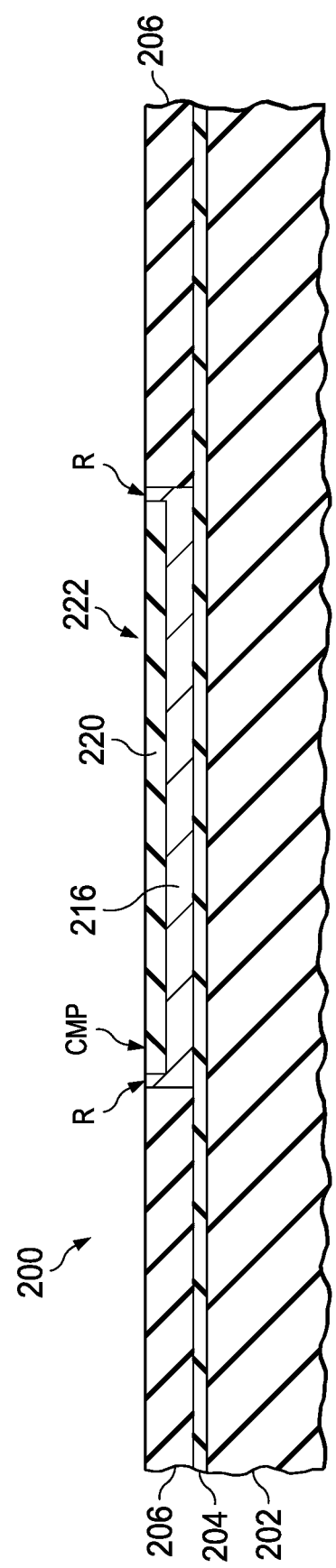

As shown in FIG. 4F, structure 200 may be further processed by performing a TFR CMP stopped at or in the dielectric cap layer 220 to remove the upper portions (i.e., outside the TFR trench) of TFR layer 216 and dielectric cap layer 220, and thereby define the structure of a TFR module 222 having a formed TFR element 216. In some embodiments, the CMP is performed with a target remaining oxide thickness (layer 206) of about 1000 Å (e.g., 500 Å-1500 Å).

As shown in FIG. 4F, in some embodiments, the TFR element 216 of TFR module 222 may include spikes or ridges "R" at one or more edges of the module. As discussed below, the inventors have discovered that these ridges may provide unwanted effects, e.g., regarding the temperature coefficient of resistance (TCR) of the TFR module 222. Thus, as discussed below, in some embodiments these ridges "R" may be removed by suitable processing.

As shown in FIG. 4G, structure 200 may be further processed by depositing an additional thickness of trench oxide 226, to define a combined oxide region 230 having a thickness $T_{oxide}$, which may match that of Process of Record (POR) CMOS inter metal dielectrics thickness, for example of about 4K (e.g., between 3K-5K). In one embodiment, oxide region 206 remaining after CMP shown in FIG. 4K has a thickness of about 1K, and an additional 3K of trench oxide 226 is added in the step shown in FIG. 4G, to provide a total thickness $T_{oxide}$ of about 4K. In other words, regions of the wafer outside the location of TFR module insertion may be the same as without the TFR module formation. Thus, the TFR module and fabrication process steps can be modularized, and can be added or omitted without altering other part of the wafer or process.

As shown in FIG. 4H, the structure may be masked and patterned and etched to define a pair of TFR head/contact trenches (or "metal 1" or "M1" trenches) 234. The etch may stop on TFR element 216 and extend down to field oxide 202 in areas laterally outside the TFR element 216.

In some embodiments, ridges R may not removed by the trench etch. For example, the trench etch may be a Florine based etch, which may have little effect on the TFR element (e.g., SiCr or SiCCr). Further, in some embodiments a sputter etch may be performed to clean the wafer before deposition of a Ta/TaN barrier 240 (discussed below). The sputter is non-selective, and may etch may etch away about 100 Å of both the TFR film/element and the neighboring oxide. This etch may reduce the ridge, but also reduces the TFR film/element thickness, which limits the extent to which the ridge may be removed.

Figure 4I:
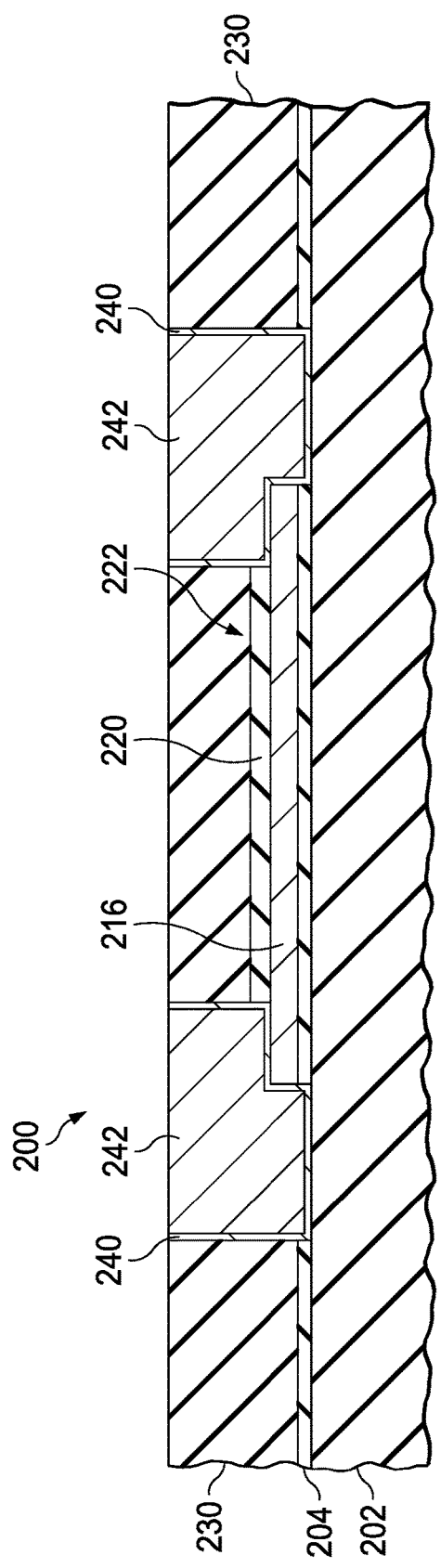

As shown in FIG. 4I, TFR head/contact trenches (M1 trenches) 234 (shown in FIG. 4H) may be filled with copper or other conductive material, annealed, and polished, e.g., via CMP, e.g., using known CMOS Cu BEOL processes. First, a M1 barrier or seed layer 240 may be deposited, which may include a copper diffusion barrier layer (e.g., Ta, TaN, or a bi-layer of both) and/or a copper seed layer deposited via PVD process, for example. An M1 (e.g., copper) plating may then be performed to fill M1 trenches 234. An M1 (e.g., copper) anneal may then be performed, e.g., at about 200° C. (e.g., 100-250° C.) for about 30 minutes, followed by an M1 (e.g., copper) CMP process. The resulting structures 242 may define TFR heads/contacts for TFR 222.

In this manner, a TFR module may be formed as part of a typical CMOS M1 creation process, using a damascene approach, and using only a single mask layer. Further, the TFR element may formed prior to the TFR heads/contacts (e.g., Metal 1 layer), and thus may be formed from any suitable TFR material and annealed to achieve 0 ppm or near 0 ppm TCR.

As discussed above regarding FIG. 4F, the TFR element 216 may include ridges "R" at one or more edges of the TFR element 216. The inventors have discovered that these ridges may provide unwanted effects, e.g., regarding the temperature coefficient of resistance (TCR) of the TFR module 222. Further, the inventors also discovered that these effects may increase as a function of the increasing height of TFR ridge, which is the vertical length of the ridge extending above the lateral portion of the TFR element.

Figure 5:
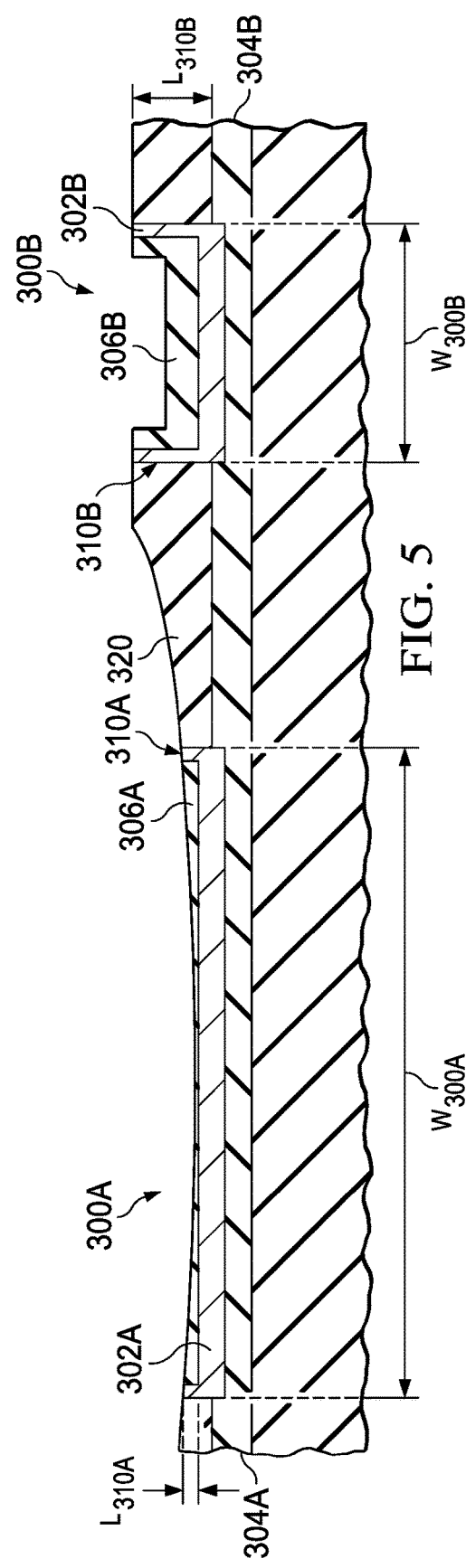
FIG. 5 illustrates a wide TFR and a narrow TFR formed according to the process shown in FIGS. 4A-4I.

FIG. 5 illustrates two example TFR modules 300A and 300B formed according to the process shown in FIGS. 4A-4I. TFR module 300A includes a TFR film/element 302A formed between dielectric layers 304A and 306A, and includes ridges 310A extending upwardly from the edges of TFR element 302A. Similarly, TFR module 300B includes a TFR film/element 302B formed between dielectric layers 304B and 306B, and includes ridges 310B extending upwardly from the edges of TFR element 302B.

As shown, TFR module 300A is formed with a relatively wide TFR element 302A and TFR module 300B is formed with a relatively narrow TFR element 302B, such that W300A>W300B. FIG. 5 also illustrates an inherent result of the CMP process to define the final shapes/structures of TFR modules 300A and 300B (e.g., the CMP process performed at FIG. 4F discussed above), wherein the CMP typically "dishes" more for wider TFR structures, such that the ridge height after CMP is inversely related to the TFR width. Thus, as shown, TFR ridge height L310A for wide TFR 300A is less than TFR ridge height L310B for narrow TFR 300B. Furthermore, the relative contribution of the TFR ridges to the overall TFR resistance significantly decreases with increased TFR element width. The combined effects contribute to the TCR performance sensitivity to the TFR width, as shown in FIG. 7.

Figure 6:
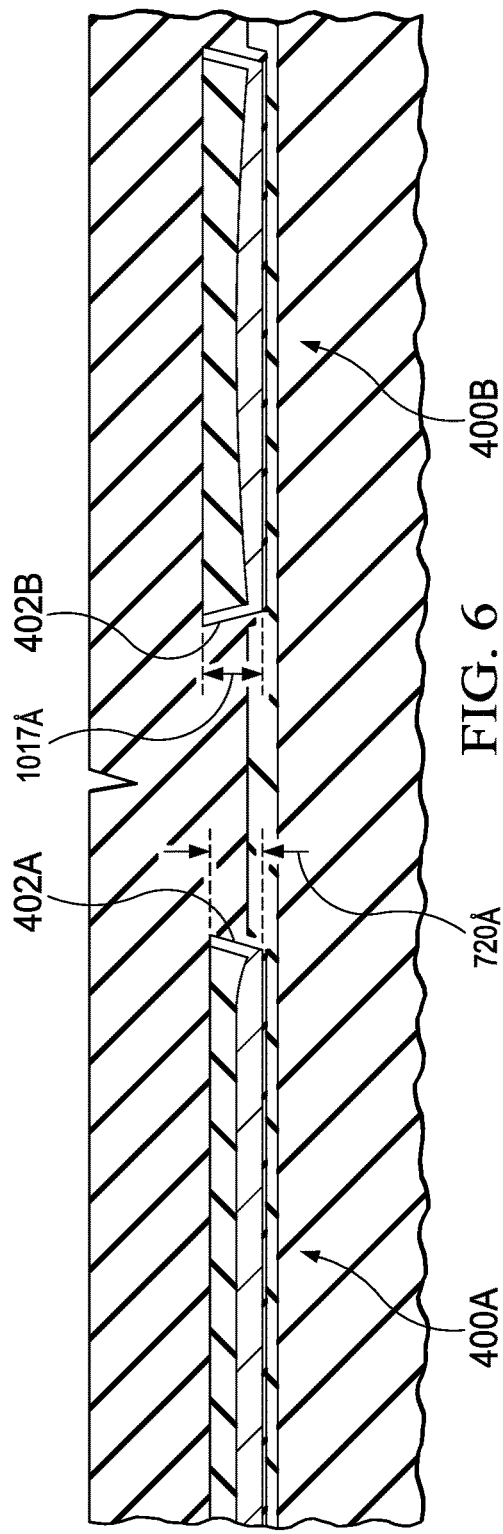
FIG. 6 show SEM images of a wide TFR and a narrow TFR formed according to the process shown in FIGS. 4A-4I.

FIG. 6 shows SEM images of two example TFR modules 400A and 400B formed according to the process shown in FIGS. 4A-4I, and subjected to the same CMP process (e.g., the CMP process performed at FIG. 4F discussed above). TFR 400A has a substantially greater width than TFR 400B. As a result from the CMP dishing, as discussed above, the ridges 402B of the narrower TFR 400B have a greater height (1017 Å) than the ridges 402A of the wider TFR 400A (720 Å).

FIG. 7 is a graph showing example temperature coefficient of resistance (TCR) data for example TFR modules formed according to the process shown in FIGS. 4A-4I. In particular, FIG. 7 shows TCR data as a function of TFR element width (ranging from 0.9 µm to 10 µm), for a constant TFR length (100 µm). For each TFR element width, the graph shows TCR data for 9 different TFR structures at 8 different dies (sites) on the same wafer. As shown, as the TFR structure width decreases (thus, the ridge height increases and the relative contribution to TFR resistance from the ridge increases), the TCR varies more widely as a function of wafer site, and the average TCR also increases. Thus, according to the data shown in FIG. 7, the effect of the TFR ridges may substantially increase as TFR width decreases.

Thus, some embodiments may actively eliminate the TFR element "ridges," e.g., to control or improve resulting TCR characteristics.

Figure 8:
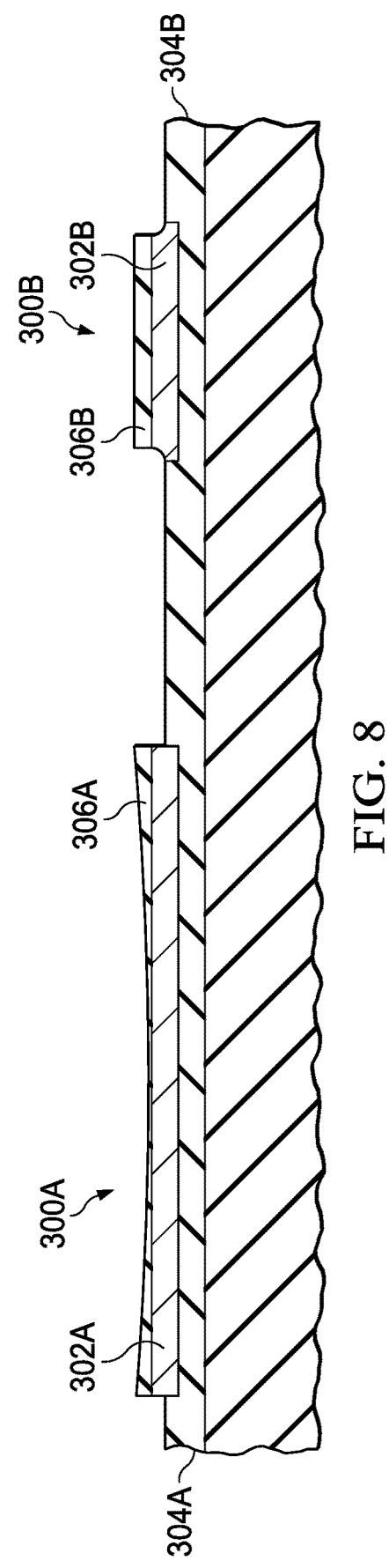
FIG. 8 illustrates an example elimination of TFR element ridges that may be formed in some embodiments.

FIG. 8 illustrates an example elimination of TFR element ridges that may be formed in some embodiments, e.g., the ridges "R" that may be formed by the example process shown in FIGS. 4A-4I discussed above. In particular, FIG. 8 shows the result of an example ridge removal process performed on the example TFR modules 300A and 300B shown in FIG. 5.

In some embodiments, the ridge removal process may include a cleaning process and a wet etch process to remove the outer lateral edges/portions of the respective TFR element 302A, 302B that includes the TFR ridges. The cleaning process may comprise, for example, a spin-based cleaning process, e.g., using a cleaning tool by SEZ Holding AG headquartered in Zurich, Switzerland or its US affiliate SEZ America Inc. located at 4822 S 40th St, Phoenix, Ariz. 85040, for example. The wet etch may comprise, for example, a mixed acid etch (MAE) to etch the outer edges of each respective TFR element 302A, 302B including the respective TFR ridges (e.g., SiCr), which etch may stop on the nitride layer 304A, 304B.

With respect to the example process shown in FIGS. 4A-4I, the ridge removal process may be performed between the steps shown in FIGS. 4F and 4G. A resulting process is discussed below with reference to FIGS. 10A-10J.

Figure 9A:
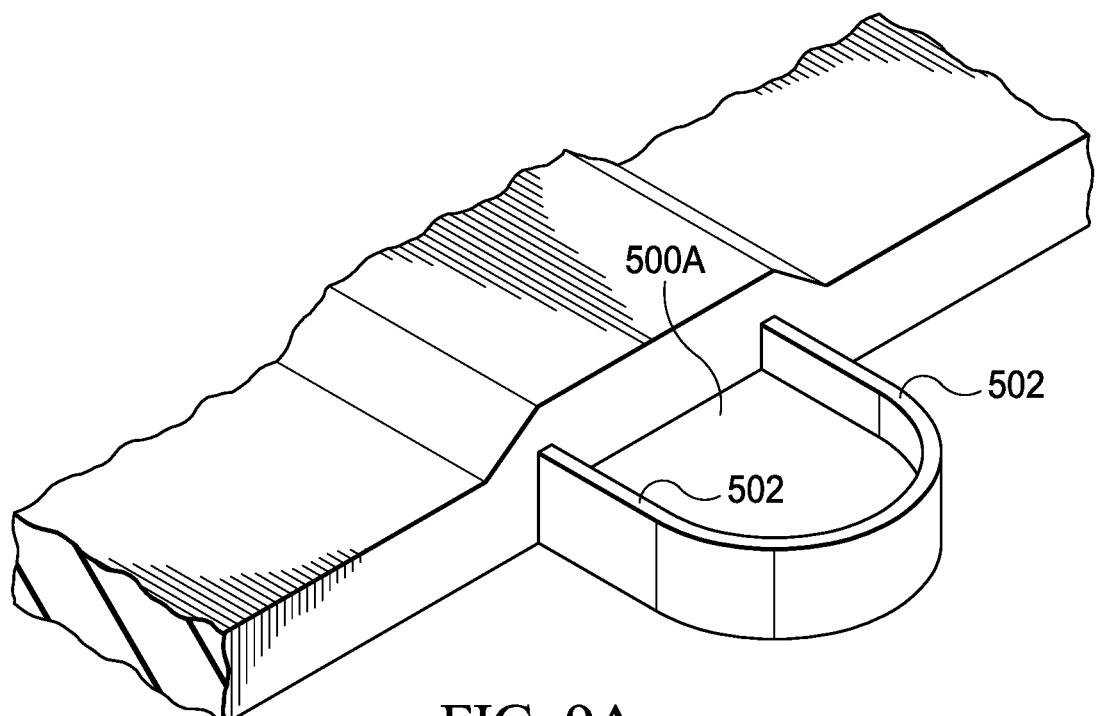
FIGS. 9A and 9B are three-dimensional views of an example TFR element including an upwardly-extending ridge and an example TFR element after removal of the upwardly-extending ridge, according to one example.
Figure 9B:
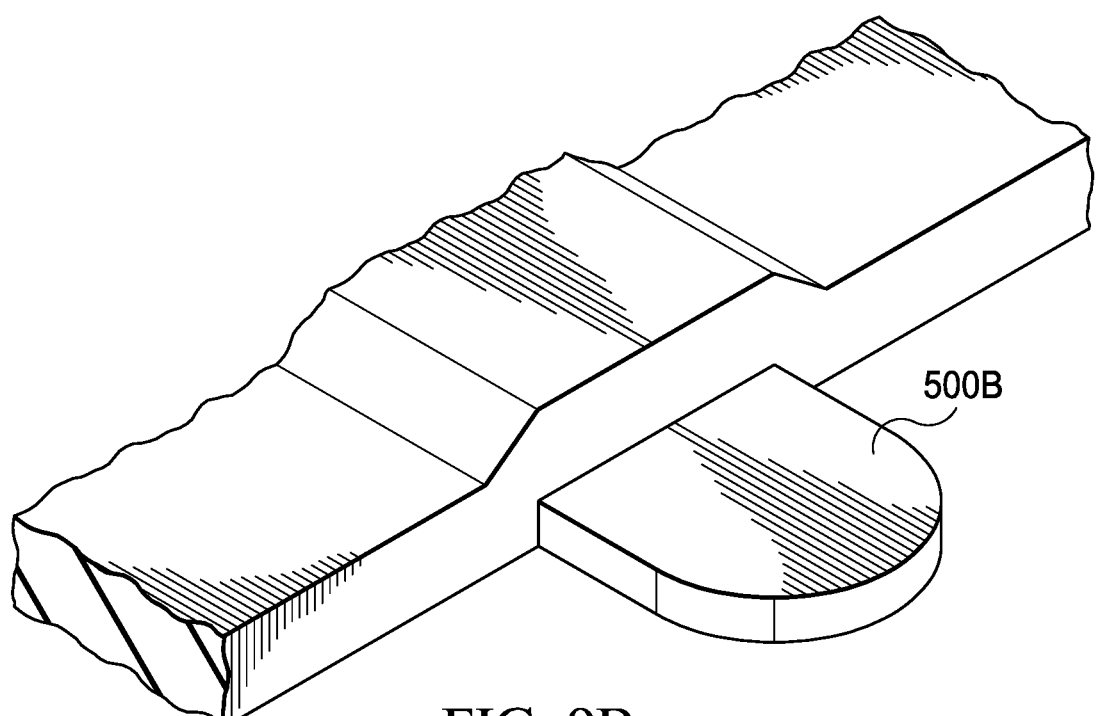

FIG. 9A is a three-dimensional view from above of an example TFR element 500 including an upwardly-extending ridge 502 extending around an outer edge of the TFR element 500A after metal 1 trench etch. FIG. 9B is a three-dimensional view from above of an example TFR element 500 after removal of the upwardly-extending ridge 502, e.g. also after metal 1 trench etch, according to the techniques discussed above.

FIG. 10A-10J illustrate an example process for forming the example IC structure 600 including the TFR module shown in FIG. 3, which process includes the elimination of "ridges" extending from the TFR film, according to one example embodiment. The method shown in FIG. 10A-10J generally corresponds with the method shown in FIGS. 4A-4I. Thus, in FIGS. 10A-10J, reference numbers 6xx are used for elements of IC structure 600 that correspond with elements 2xx of IC structure of 200 shown in FIGS. 4A-4I.

Figure 10F:
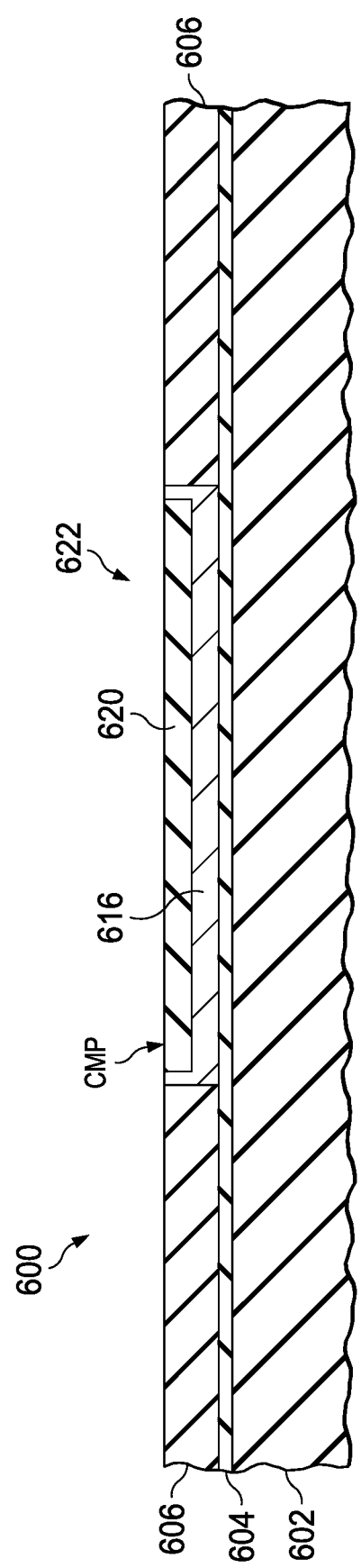

In some embodiments, the steps shown in FIGS. 10A through 10F may be similar or identical to the steps shown in FIGS. 4A through 4F, discussed above. Thus, as shown in FIG. 10F, a CMP process may be performed on structure 600 to remove the upper portions (i.e., outside the TFR trench) of TFR layer 616 and dielectric cap layer 620, and thereby define the structure of a TFR module 622 having a formed TFR element 616 including ridges R at lateral edges of the element.

Figure 10G:
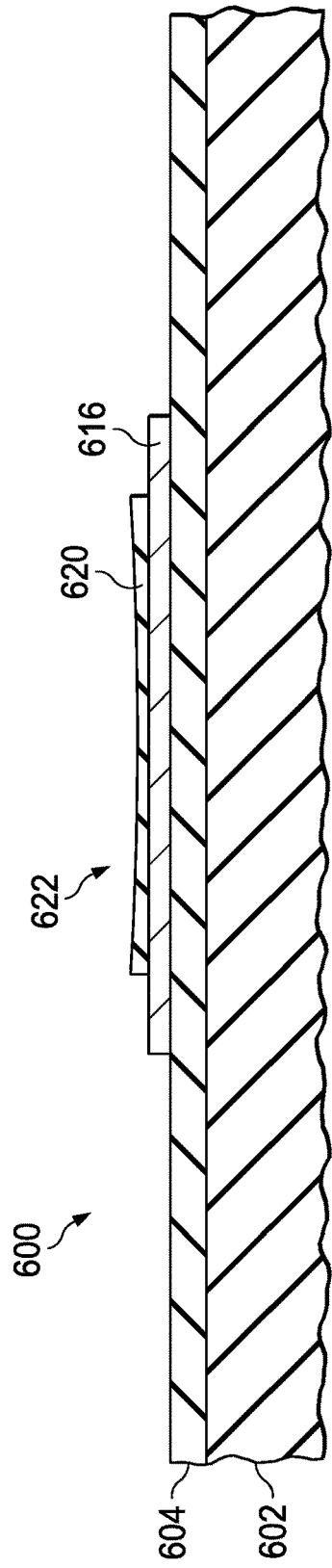

As shown in FIG. 10G, structure 600 may be further processed to remove the TFR ridges R, e.g., as discussed above regarding FIG. 8. For example, a cleaning process may be performed, followed by a wet etch, e.g., a mixed acid etch (MAE), to etch the outer edges of each respective TFR element 616 including the TFR ridges R, which etch may stop on the nitride layer 604.

Figure 10H:
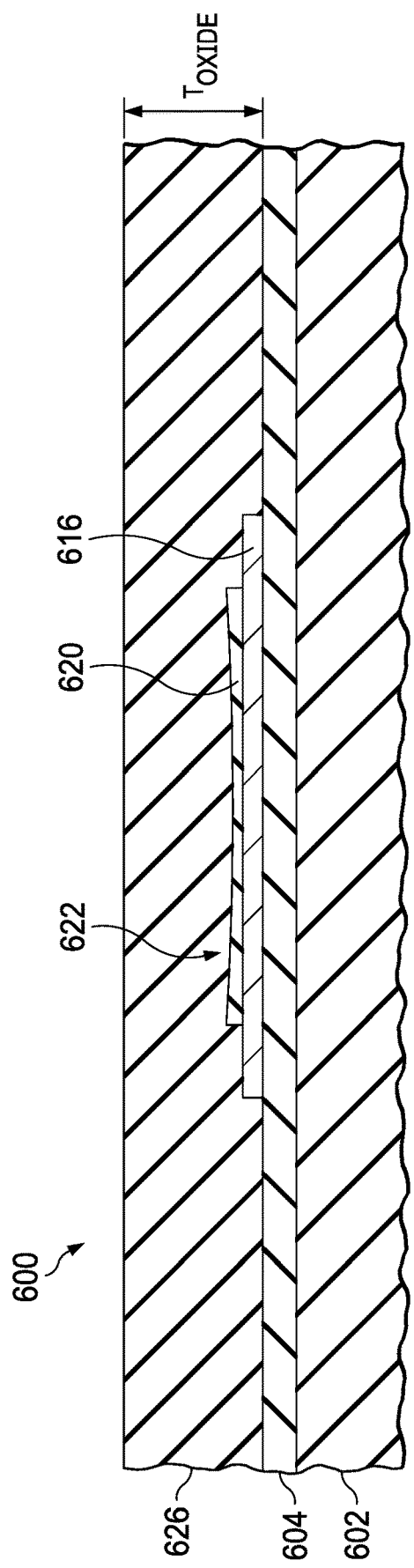

As shown in FIG. 10H, structure 600 may be further processed by depositing a trench oxide layer 626 having a thickness $T_{oxide}$ of about 4K (e.g., between 3K-5K).

As shown in FIG. 10I, the structure may be masked and patterned and etched to define a pair of TFR head/contact trenches (or "metal 1" or "M1" trenches) 634. The etch may stop on TFR element 616 and extend down to field oxide 602 in areas laterally outside the TFR element 616.

As shown in FIG. 10J, TFR head/contact trenches (M1 trenches) 634 may be filled with copper or other conductive material, annealed, and polished, e.g., via CMP, e.g., using known CMOS Cu BEOL processes. First, a M1 barrier or seed layer 640 may be deposited, which may include a copper diffusion barrier layer (e.g., Ta, TaN, or a bi-layer of both) and/or a copper seed layer deposited via PVD process, for example. An M1 (e.g., copper) plating may then be performed to fill M1 trenches 634. An M1 (e.g., copper) anneal may then be performed, e.g., at about 200° C. (e.g., 100-300° C.) for about 30 minutes, followed by an M1 (e.g., copper) CMP process. The resulting structures 642 may define TFR heads/contacts for TFR 622.

FIGS. 11A and 11B show graphs indicating an effect of TFR ridges on the temperature coefficient of resistance (TCR) of respective TFR modules, for a group of example TFR modules. In particular, FIG. 11A shows example TCR data for example TFR modules formed with TFR ridges (e.g., according to the example process shown in FIGS. 4A-4I), and FIG. 11B shows example TCR data for example TFR modules formed without TFR ridges (e.g., according to the example technique shown in FIG. 8 or example process shown in FIGS. 10A-10J).

Each FIGS. 11A and 11B shows TCR data as a function of TFR element width (ranging from 0.9 μm to 10 μm), for a constant TFR length (100 μm). FIG. 11A shows TCR data for 9 different TFR structures at 8 different sites (dies) on the same wafer for each TFR element width, and FIG. 11B shows TCR data for the same 9 different TFR structures at 4 different sites (dies) with different TFR element width. As shown in FIG. 11A, the example TFR elements with TFR ridges have TCR values of less than 700 ppm/° C., less than 500 ppm/° C., less than 300 ppm/° C., less than 200 ppm/° C., or less than 100 ppm/° C., depending on the TFR element width. Further, as shown in FIG. 11B, the example TFR elements without TFR ridges have TCR values of about 40 ppm/° C., e.g., in the range of 30-50 ppm/° C., for all tested TFR element widths.

A comparison of FIGS. 11A and 11B shows that the TCR values for the TFR elements without TFR ridges are (a) generally lower than the TCR values for the TFR elements with TFR ridges, particularly for small width TFR elements, and (b) less variable as a function of TFR width, particularly for small width TFR elements.

The invention claimed is:

1. A method for manufacturing a thin film resistor (TFR) module in an integrated circuit (IC) structure, the method comprising:
    forming a TFR element over a substrate, the TFR element including an upwardly-extending TFR ridge that extends upwardly from a laterally-extending region of the TFR element;
    performing an annealing process to reduce a temperature coefficient of resistance (TCR) of the TFR element; and
    performing a ridge removal process to remove the upwardly-extending TFR ridge;
    forming an oxide layer over the TFR element having the removed upwardly-extending TFR ridge;
    performing at least one etch through the oxide layer to define an opening exposing both (a) a top surface of the laterally-extending region of the TFR element and (b) a lateral side surface of the laterally-extending region of the TFR element;
    forming a conductive TFR head in the opening, wherein the TFR head conductively contacts both the top surface and the lateral side surface of the laterally-extending region of the TFR element.

2. The method of claim 1, wherein the TFR element comprises SiCr or SiCCr.

3. The method of claim 1, wherein the annealing process comprises annealing the TFR element to achieve a TCR value of 0+−700 ppm/° C. for the TFR element.

4. The method of claim 1, wherein the annealing process comprises annealing the TFR element to achieve a TCR value of 0+−300 ppm/° C. for the TFR element.

5. The method of claim 1, wherein the annealing process comprises annealing the TFR element to achieve a TCR value of 0+−100 ppm/° C. for the TFR element.

6. The method of claim 1, wherein the annealing process comprises annealing the TFR element to achieve a TCR value of 40+−20 ppm/° C. for the TFR element.

7. The method of claim 1, wherein the annealing process comprises annealing the TFR element at a temperature in a range of 450° C. to 550° C.

8. The method of claim 1, wherein forming the conductive TFR head comprises forming a metal 1 layer.

9. The method of claim 1, wherein forming the conductive TFR head comprises forming a conductive structure using a dual damascene process.

10. The method of claim 1, wherein the ridge removal process to remove the upwardly-extending TFR ridge comprises at least one etch.

11. The method of claim 10, wherein the ridge removal process includes a wet etch.

* * * * *